(12) United States Patent
Bito

(10) Patent No.: US 8,253,218 B2
(45) Date of Patent: Aug. 28, 2012

(54) PROTECTIVE ELEMENT AND SEMICONDUCTOR DEVICE

(75) Inventor: Yasunori Bito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/024,033

(22) Filed: Feb. 9, 2011

(65) Prior Publication Data

US 2011/0193191 A1   Aug. 11, 2011

(30) Foreign Application Priority Data

Feb. 9, 2010  (JP) ................... 2010-026440

(51) Int. Cl.
*H01L 21/70*   (2006.01)
(52) U.S. Cl. ...................... 257/513; 257/279
(58) Field of Classification Search .............. 257/513, 257/279
See application file for complete search history.

(56) References Cited

U.S. PATENT DOCUMENTS

| | | | |
|---|---|---|---|
| 6,166,404 A * | 12/2000 | Imoto et al. | ................... 257/279 |
| 7,358,788 B2 | 4/2008 | Asano et al. | |
| 7,495,268 B2 | 2/2009 | Kato et al. | |
| 7,829,957 B2 | 11/2010 | Kato et al. | |
| 2005/0263822 A1 | 12/2005 | Asano | |
| 2006/0252651 A1 | 11/2006 | Asano et al. | |
| 2007/0295991 A1 | 12/2007 | Kato et al. | |
| 2008/0237638 A1 | 10/2008 | Bito | |
| 2008/0251837 A1 | 10/2008 | Kato et al. | |

FOREIGN PATENT DOCUMENTS

| | | |
|---|---|---|
| JP | 2005-340549 | 12/2005 |
| JP | 2006-310512 | 11/2006 |
| JP | 2008-010468 | 1/2008 |
| JP | 2008-258261 | 10/2008 |
| JP | 2008-263146 | 10/2008 |

* cited by examiner

*Primary Examiner* — Douglas Menz
(74) *Attorney, Agent, or Firm* — Young & Thompson

(57) ABSTRACT

A semiconductor device includes at least one semiconductor element having a semiconductor stack containing a channel layer and a cap layer and a lower electrode and an upper electrode formed over a semiconductor stack, and at least one protective element having the semiconductor stack in common with the semiconductor element for protecting the semiconductor element. The protective element includes a recessed portion that penetrates the cap layer in the direction of the thickness, an insulation region formed in the semiconductor stack from the bottom of the recessed portion 221 in the direction of the thickness, and a pair of ohmic electrodes and formed on both sides of the recessed portion and connected to the cap layer.

8 Claims, 12 Drawing Sheets

PROTECTIVE ELEMENT AND SEMICONDUCTOR DEVICE

CROSS-REFERENCE TO RELATED APPLICATIONS

The disclosure of Japanese Patent Application No. 2010-26440 filed on Feb. 9, 2010 including the specification, drawings and abstract is incorporated herein by reference in its entirety.

BACKGROUND

1. Field of the Invention

The present invention concerns a protective element for protecting a semiconductor element, and a semiconductor device having the protective element.

2. Description of Related Art

In a semiconductor device having a substrate comprising a compound semiconductor, for example, GaAs as a substrate, a protective element of an $n^+$-i-$n^+$ configuration in which ion implanted from a cap layer ($n^+$) to an epitaxial wafer having a cap layer with addition of an n type impurity at a high concentration to form an insulation region (i) in the direction of the thickness is sometimes used for protecting a semiconductor element such as a capacitor which is sensitive to electrostatic destruction.

Japanese Patent Laid-Open No. 2006-310512 describes a compound semiconductor switch circuit device having a protective element of an $n^+$-i-$n^+$ configuration for protecting a logic circuit of a monolithic microwave integrated circuit (MMIC) against electrostatic destruction (refer to reference numeral 200 in FIG. 5).

In the device of Japanese Patent Laid-Open No. 2006-310512, a non-doped stacked buffer layer, an $n^+$-AlGaAs electron supply layer, a spacer layer, a non-doped InGaAs channel layer, a spacer layer, an $n^+$-AlGaAs electron supply layer, a non-doped AlGaAs barrier layer, and an $n^+$-GaAs cap layer are stacked successively in this order over a GaAs substrate. $B^+$ ions are implanted to the semiconductor stack from above the cap layer (137) and a portion from the cap layer to the non-doped stacked buffer layer is insulated in the direction of the thickness to form an insulation region (50). Then, an interconnection metal layer in contact with an $n^+$ impurity region is disposed on both sides of the insulation region to form a protective element of the $n^+$-i-$n^+$ configuration. It is described that the interconnection metal layer may be connected to the $n^+$ impurity layer either by Schottky junction or ohmic contact (paragraph 0119). When a high voltage is applied across both ends of the protective element of such a configuration, electrostatic energy flows through the $n^+$-i-$n^+$ region and a semiconductor element such as a capacitor connected with the protective element can be protected against electrostatic destruction.

Techniques relevant to the present invention include patent documents, that is, Japanese Patent Laid-Open Nos. 2005-340549, 2008-010468, 2008-258261, and 2008-263146, details of which are to be described later.

SUMMARY

In the protective element described in Japanese Patent Laid-Open No. 2006-310512, since the insulation region is formed by ion implantation from the cap layer, it is necessary to insulate both of n type carriers accumulated in the cap layer with addition of the n type impurity at a high concentration and the channel layer by ion implantation. However, since the cap layer has a high impurity concentration and a large thickness, insulation by the ion implantation may be insufficient. Accordingly, there may be a possibility that the protective element per se is destructed at a low static voltage.

According to an aspect of the present invention, a semiconductor device includes at least one semiconductor element having a semiconductor stack containing a channel layer and a cap layer and a lower electrode and an upper electrode formed over the semiconductor stack; and at least one protective element having a semiconductor stack in common with the semiconductor element for protecting the semiconductor element, and the protective element has a recessed portion that penetrates the cap layer in the direction of the thickness, an insulation region formed in the semiconductor stack from the bottom of the recessed portion in the direction of the thickness and a pair of ohmic electrodes formed on both sides of the recessed portion and connected to the cap layer.

In the semiconductor device of the present invention, electrostatic destruction of the semiconductor element is suppressed by the protective element. Further, in the protective element provided to the semiconductor device of the invention, since the recessed portion is formed by removing the cap layer at a high impurity concentration and having a large thickness, and the insulation region is formed from the bottom in the direction of the thickness, the insulation property of the insulation region is higher, the leak current is lower, and higher dielectric breakdown voltage can be obtained compared with the protective element in which the insulation region contains the cap layer. Therefore, in the semiconductor device of the invention, the electrostatic destruction of the protective element per se is also suppressed. Therefore, according to the invention, a semiconductor device suppressed from the electrostatic destruction at a high level and having a high reliability can be provided by the protective effect for the semiconductor element by the protective element and the effect of suppressing the electrostatic destruction of the protective element per se.

According to another aspect of the present invention, the protective element for protecting a semiconductor element includes:

a semiconductor stack containing a channel layer and a cap layer and a pair of electrodes;

a semiconductor stack in common with the semiconductor element, and a recessed portion that penetrates the cap layer in the direction of the thickness, an insulation region formed in the semiconductor stack from the bottom of the recessed portion in the direction of the thickness, and a pair of ohmic electrodes formed on both sides of the recessed portion and connected to the cap layer.

In the protective element of the invention, since the recessed portion is formed by removing the cap layer at a high impurity concentration and also having a large thickness, and the insulation region is formed from the bottom in the direction of the thickness, the insulation region has higher insulating property and less leakage, and higher dielectric breakdown voltage compared with the protective element in which the insulation region contains the cap layer. Accordingly, in the protective element of the invention, the electrostatic destruction of the protective element per se is suppressed.

According to the invention, a protective element suppressed from the electrostatic destruction of the element per se and a semiconductor device having the protective element and suppressed from the electrostatic destruction can be provided.

BRIEF DESCRIPTION OF THE DRAWINGS

Preferred embodiments of the present invention will be described in details based on the drawings, wherein.

DETAILED DESCRIPTION OF THE PREFERRED EMBODIMENTS

First Embodiment

Figure 1:
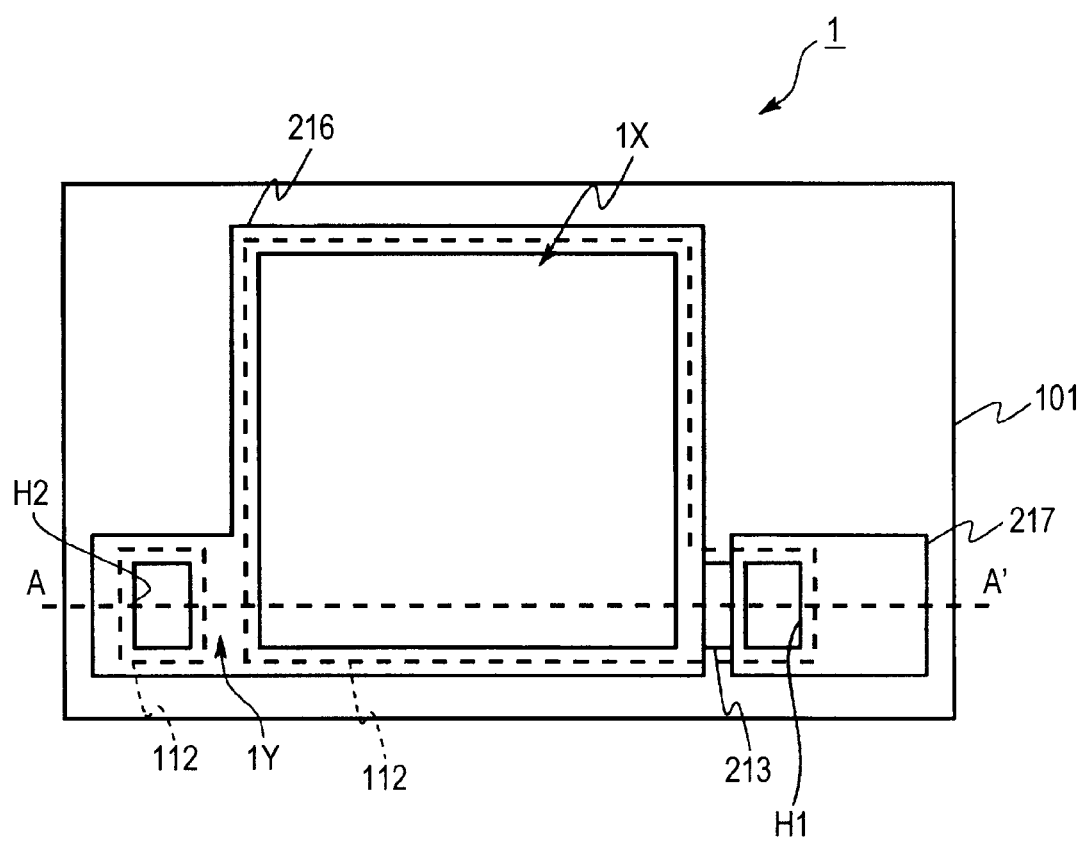
FIG. 1 is a plan view of a semiconductor device of a first embodiment according to the invention.
Figure 2:
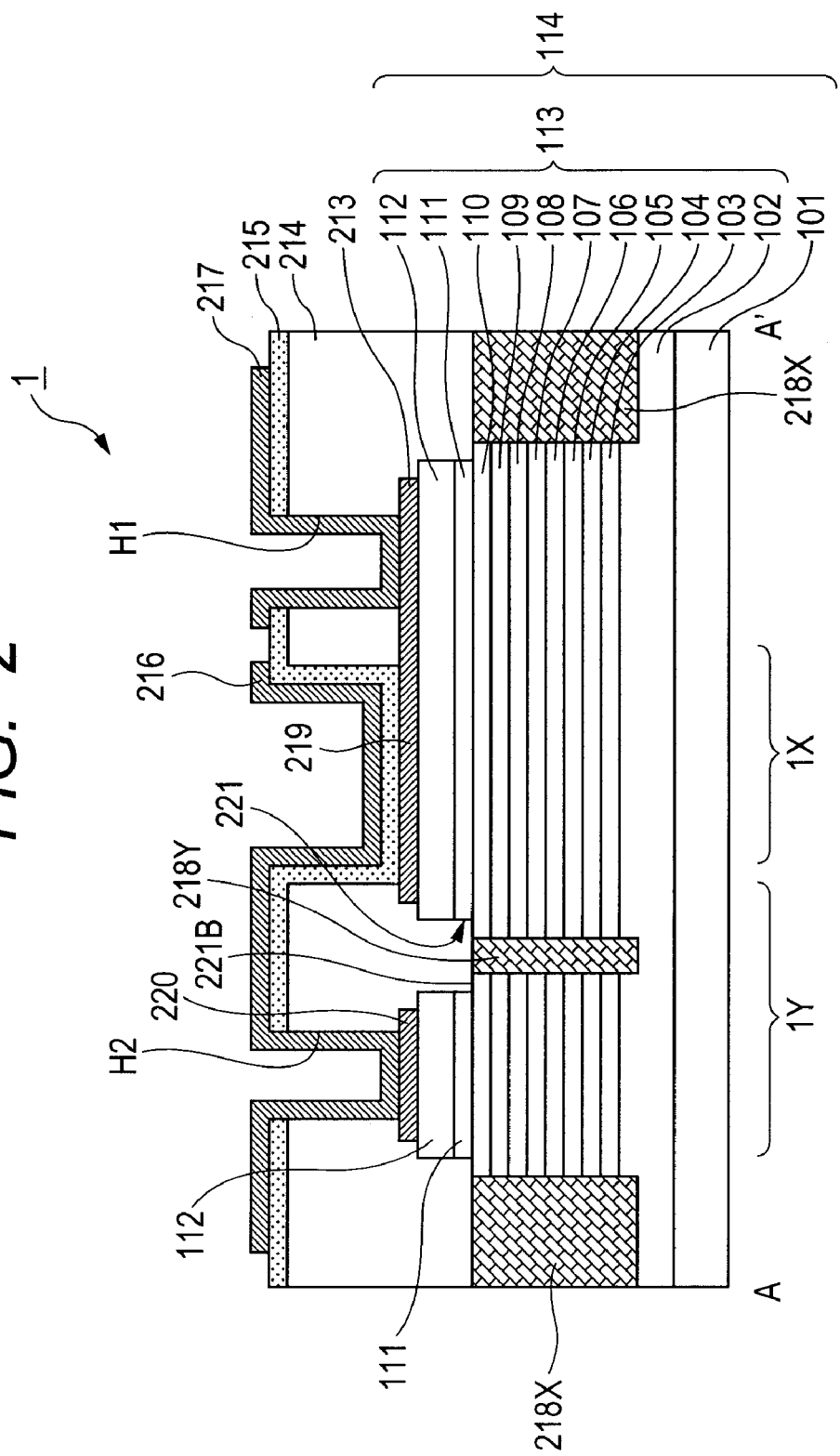
FIG. 2 is a cross sectional view along line A-A' in FIG. 1.
Figure 3:
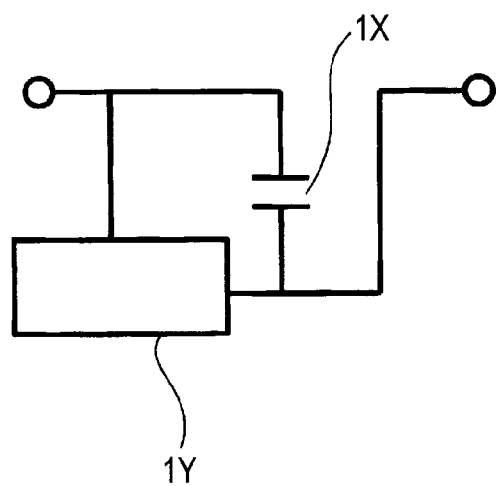
FIG. 3 is an equivalent circuit diagram of the first embodiment according to the invention.

The configuration of a semiconductor device of a first embodiment according to the present invention is to be described with reference to the drawings. FIG. 1 is a plan view, FIG. 2 is a cross sectional view along line A-A' in FIG. 1, and FIG. 3 is an equivalent circuit diagram. For making the drawings easy to see, scaling and position for each of components are made different from actual ones. Further, depending on the drawings, a portion of the components is not illustrated. While FIG. 2 is a cross sectional view, hatching is omitted optionally.

As shown in FIG. 1 and FIG. 2, in a semiconductor device 1 of this embodiment, an MIM capacitor (metal-insulator-metal configuration) (semiconductor element) 1X and a protective element 1Y for protecting the same are formed to an epitaxial wafer 114 in which a semiconductor stack 113 comprising semiconductor layers 102 to 112 is stacked over a semiconductor substrate 101.

In this embodiment, the layer structure of the epitaxial wafer 114 on the side of the semiconductor substrate 101 is as described below. However, composition/film thickness/impurity concentration of the substrates and each of the semiconductor layers to be used, and the stack structure can be properly changed in the design not being restricted to that described below.

Semiconductor GaAs substrate 101,
non-doped stacked buffer layer 102 of 500 nm thickness,
$n^+$-AlGaAs electron supply layer 103 of 4 nm thickness with addition of an Si impurity at $3.0\times10^{18}$ $cm^{-3}$,
non-doped AlGaAs spacer layer 104 of 2 nm thickness,
non-coped InGaAs channel layer 105 of 15 nm thickness.
non-doped AlGaAs spacer layer 106 of 2 nm film thickness,
$n^+$-AlGaAs electron supply layer 107 of 10 nm thickness with addition of an Si impurity at $3.0\times10^{18}$ $cm^{-3}$,
non-doped AlGaAs layer 108 of 20 nm thickness,
non-doped InGaP layer 109 of 5 nm thickness,
non-doped GaAs layer 110 of 15 nm thickness,
$n^+$-AlGaAs stopper layer 111 of 5 nm thickness with addition of an Si impurity at $4.0\times10^{18}$ $cm^{-3}$, and
$n^+$-GaAs cap layer 112 of 100 nm thickness with addition of an Si impurity at $4.0\times10^{18}$ $cm^{-3}$.

In the present specification, "stopper layer" is a layer of stopping etching for the layers situated therebelow when the layers situated thereabove are patterned by selective etching.

In this embodiment, an MIM capacitor is formed by forming a lower capacitor electrode 213 comprising an AuGe—Ni—Au alloy layer in ohmic contact with an n type semiconductor in a predetermined pattern over the $n^+$-GaAs cap layer 112 as the uppermost layer of the epitaxial wafer 114, and stacking thereover a nitride film 215 that forms a capacitor and an upper electrode interconnection 216 that serves also as an upper capacitor electrode. In the drawing, a layer denoted by a reference numeral 214 is an oxide film. A lower electrode contact interconnection 217 is connected to the lower capacitor electrode 213 by way of a through hole H1 apertured in the oxide film 214 and the nitride film 215.

In the specifications, "oxide film" means a silicon oxide film and "nitride film" means a silicon nitride film unless otherwise specified.

At the periphery of the capacitor 1X and the protective element 1Y, an insulation region 218X for device isolation of the elements from other regions is formed to a portion where the cap layer 112 is removed. The insulation region 218X is formed in the semiconductor stack 113 from the non-doped GaAs layer 110 to the surface layer portion of the non-doped stacked buffer layer 102 in the direction of the thickness by implanting $B^+$ ions from the non-doped GaAs layer 110 as the uppermost layer for the portion of the epitaxial wafer 114 from which the cap layer 112 is removed.

In this embodiment, the protective element 1Y is formed in adjacent with the capacitor 1X. The protective element 1Y has the semiconductor stack 113 (semiconductor layers 102 to 112) in common with the capacitor 1X.

Also in the protective element 1Y, the $n^+$-GaAs cap layer 112 is formed in a predetermined pattern. In the protective element 1Y, the $n^+$-GaAs cap layer 112 is removed partially to form a recessed portion 221 that penetrates the layer in the direction of the thickness. An insulation region 218Y is formed in the semiconductor stack 113 from the bottom 221B of the recessed portion 221 in the direction of the thickness. The insulation region 218Y is formed by a step identical with that for the insulation region 218X. Accordingly, the insulation region 218Y is formed in the same manner as for the insulation region 218X in the semiconductor stack 113 from the non-doped GaAs layer 110 to the surface layer portion of the non-doped stacked buffer layer 102 in the direction of the thickness by implanting $B^+$ ions from the non-doped GaAs layer 110.

In the protective element 1Y, a pair of ohmic electrodes 219 and 220 are formed over the $n^+$-GaAs cap layer 112 formed on both sides of the recessed portion 221.

In FIG. 2, the ohmic electrode 220 is formed in a predetermined pattern over the cap layer 112 shown on the left of the recessed portion 221. The ohmic electrode 220 comprises an alloy layer identical with that of the lower capacitor electrode 213 and formed by the step identical with that for the lower capacitor electrode 213. An upper electrode interconnection 216 of the capacitor 1X is connected by way of a through hole H2 apertured in the oxide film 214 and the nitride film 215 to the ohmic electrode 220.

In this embodiment, according to the configuration described above, the protective element 1Y is formed in the forming region of the upper electrode interconnection 216 that also serves as the upper electrode of the capacitor 1X. In this embodiment, the lower capacitor electrode 213 serves also as the other electrode 219 of the protective element 1Y. As shown in FIG. 3, the protective element 1Y is connected in parallel with the capacitor 1X in view of the equivalent circuit.

The protective element 1Y is an element of an o-$n^+$-i-$n^+$-o configuration having (ohmic electrode)-($n^+$-GaAs cap layer)-(insulation region)-($n^+$-GaAs cap layer)-(ohmic electrode). When a high voltage is applied across both ends of the protective element 1 of the configuration described above, a static energy flows through the o-$n^+$-i-$n^+$-o region to suppress the application of the high voltage to the capacitor 1X connected with the element, thereby capable of protecting the capacitor from electrostatic destruction.

In the protective element 1Y, since the recessed portion 221 is formed by partially removing the cap layer 112 at a high impurity concentration and also having a large thickness, and the insulation region 218Y is formed from the bottom 221B thereof in the direction of the thickness, the insulation region 218Y has higher insulation property and lower leakage, and a high dielectric breakdown voltage than those of the protective element described in Japanese Patent Laid-Open No. 2006-310512 where the insulation region contains the cap layer. Accordingly, in the semiconductor device 1 of this embodiment, electrostatic destruction of the protective element 1Y per se can also be suppressed. Therefore, according to this embodiment, a semiconductor device 1 suppressed from the electrostatic destruction at a high level and having high reliability can be provided due to the protective effect of the capacitor 1X by the protective element 1Y and the effect of suppressing the electrostatic destruction of the protective element 1Y itself.

Further, in this embodiment, since the pair of electrodes 219 and 220 forming the protective element 1Y have an ohmic contact property, the electrodes 219 and 220 are in contact with the $n^+$ cap layer 112 at a low resistance and the electrostatic energy can be released rapidly. Accordingly, even when the resistance of the insulation region 218Y is lowered by the application of high voltage, a high current can be caused to flow and released.

Figure 4:
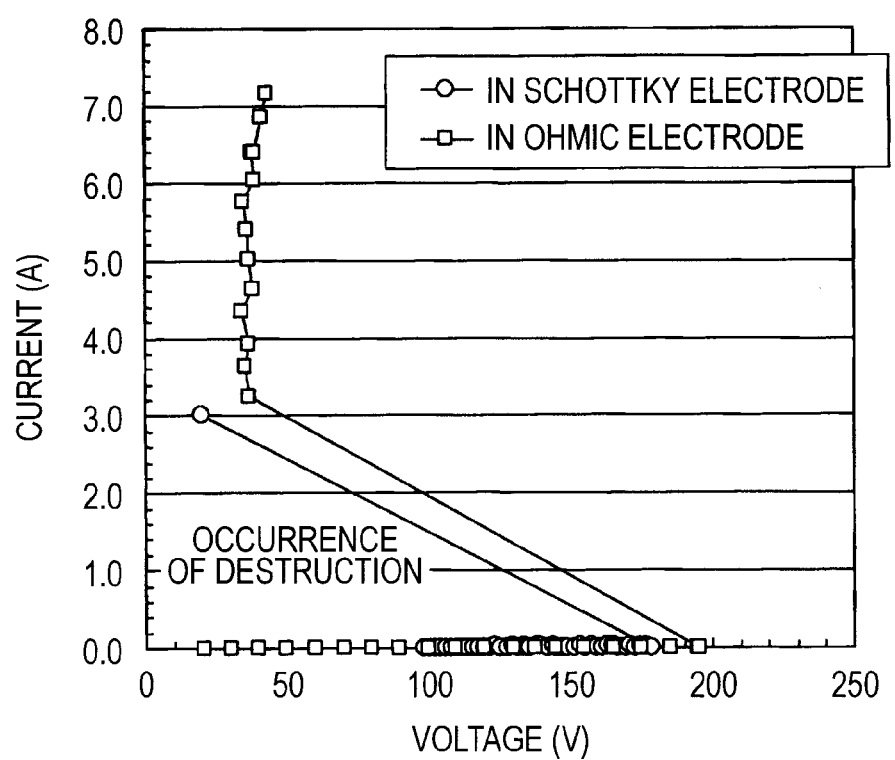
FIG. 4 is a graph showing an example for the result of TLP measurement for the first embodiment according to the invention.

FIG. 4 shows an example of a snap back property in the configuration of the semiconductor device 1 of this embodiment obtained by TLP (Transmission Line Pulse) measurement for each of the cases of using the ohmic electrode and the Schottky electrode respectively as a pair of electrodes forming the protective element 1Y.

In order that the protective element operates favorably, it is necessary then the resistance of the insulation region is lowered by the application of a high voltage, a large current flows in the state of low resistance after the current starts to flow and the voltage is lowered. In the protective element, the electrostatic energy can be released rapidly by attaining the state of lowered resistance. It has been found that the protective element suffers from electrostatic destruction just after the lowering of the resistance in a case of the protective element having the Schottky electrode. On the other hand, in the protective element having the ohmic electrode, the current that can be caused to flow after lowering of the resistance is as high as 3 A or more and high electrostatic breakdown voltage can be obtained.

Further, in this embodiment, since the lower capacitor electrode 213 also serves as one electrode 219 of the protective element 1Y and, further, the protective element 1Y is disposed in the forming region of the upper electrode interconnection 216 for the capacitor 1X, the element area for the total of the capacitor 1X and the protective element 1Y is identical with the area for the capacitor 1X alone and the size of the semiconductor device 1 can be decreased.

Provision of the recessed portion in the cap layer in the semiconductor device of the related art is described in Japanese Patent Laid-Open Nos. 2005-340549, 2008-010468, 2008-258261, and 2008-263146 previously shown in the paragraph of the "Description of Related Art".

Japanese Patent Laid-Open No. 2005-340549 discloses a semiconductor device including a resistance element (100) having a recessed portion where a cap layer is removed to expose the semiconductor layers below the cap layer and resistance element electrodes connected respectively to the cap layer on both ends of the recessed portion (claim 1, FIG. 3A).

In the resistance element (100) described in Japanese Patent Laid-Open No. 2005-340549, a recessed portion (101) where a barrier layer (36) is exposed is disposed, and resistance element electrodes (103, 104), a contact portion (102), and a channel layer (35) form a current path of a resistor, and the channel layer (35) forms a resistance layer. Since the sheet resistance of the channel layer (35) is higher by several times than that of the cap layer (37), the resistance element (100) has a high resistance value for a short distance (paragraph 0064).

The resistance element (100) described in Japanese Patent Laid-Open No. 2005-340549 is subjected to device isolation from other regions by an insulation region (50) formed by ion implantation from the cap layer (37) and insulated from the cap layer (37) to the buffer layer (32) in the direction of the thickness.

The resistance element (100) described in Japanese Patent Laid Open No. 2005-340549 is different, with respect to the position of forming the insulation region, from the protective element of the present invention in which the insulation region is formed below the recessed portion, and this is not the element of $n^+$-i-$n^+$ configuration. Further, while the insulation region in the protective element of the present invention does not contain the cap layer, the insulation region of the resistance element described in Japanese Patent Laid-Open No. 2005-340549 contains the cap layer and the insulation property of the insulation region is not high.

While the configuration identical with that of the present invention is described as reference 111 in FIG. 1 of Japanese Patent Laid-Open No. 2008-010468, as reference numeral 22 in FIG. 1 of Japanese Patent Laid-Open No. 2008-258261, and as reference 112 in FIG. 1 of Japanese Patent Laid-Open No. 2008-263146, each of them is a device isolation region for FET and not a protective element.

As has been described above, this embodiment can provide a semiconductor device 1 suppressed for electrostatic destruction and having a high reliability. The present inventors could obtain a small-sized MIM capacitor having a high electrostatic breakdown voltage of 350 V or higher by a machine model (MM) method and 5 kV or higher by a human body model (HBM) method by the configuration of this embodiment.

(Example of Design Change for First Embodiment)

In the first embodiment, while description has been made to a case of forming the insulation regions 218X and 218Y by implantation of $B^+$ ion, implanted ions are not restricted only to the $B^+$ ions and other ions that deactivate $n^+$ carriers can also be used. The insulation regions 218X and 218Y may be formed also by implantation of He ions. The present inventors could obtain a small-sized MIM capacitor having a high electrostatic breakdown voltage of 350 V or higher by the MM method and 5 kV or higher by HBM method also in such design change.

In the first embodiment, while the lower capacitor electrode 213 and the ohmic electrode 220 have been formed of the AuGe—Ni—Au alloy layer, any composition may be used so long as the layer can be in ohmic contact with a semiconductor layer with addition of the n-type impurity at a high concentration. Preferred composition for the lower capacitor electrode 213 and the ohmic electrode 220 include Ni—AuGe—Au alloy, NiGeIn—Au alloy, and PdInGe—Au alloy in addition to the AuGe—Ni—Au alloy. The present inventors could obtain a small-sized MIM capacitor having a high electrostatic breakdown voltage of 350 V or higher by the MM method and 5 kV or higher by the HBM method also in such design change.

In the first embodiment, while the cap layer 112 has been formed of the n$^+$-GaAs layer, the composition of the cap layer 112 can also be changed optionally in the design and the layer may be of a stacked structure. Conforming to the composition for the cap layer 112, the composition of the stopper layer 111 therebelow can also be changed optionally in the design. The cap layer 112 may be, for example, a stacked n$^+$-InGaAs/n$^+$-GaAs stacked structure. In this case, the stopper layer 111 can be formed, for example, of an n$^+$-InGaP layer. The present inventors could obtain a small-sized MIM capacitor having a high electrostatic breakdown voltage of 350 V or higher by the MM method and 5 kV or higher by the HBM method also in this design change.

In the first embodiment, while the semiconductor layer 110 in contact with the oxide film 214 as the insulation film has been formed of the non-doped GaAs layer in the insulation regions 218X and 218Y, the composition of the semiconductor layer 110 can be optionally changed in the design. The semiconductor layer 110 may be formed, for example, of an AlGaAs layer or an InGaP layer. The present inventors could obtain a small-sized MIM capacitor having a high electrostatic breakdown voltage of 350 V or higher by the MM method and 5 kV or higher by the HBM method also in such design change.

In the first embodiment, while it has been described to a case where the semiconductor substrate 101 is a GaAs substrate, the semiconductor substrate 101 is not particularly restricted and any substrate capable of forming the capacitor 1X and the protective element 1Y may be used. For the semiconductor substrate 101, an InP substrate, a GaN substrate, etc. can also be used. The same effect as that of the first embodiment can be obtained also by using such substrates.

Second Embodiment

Figure 5:
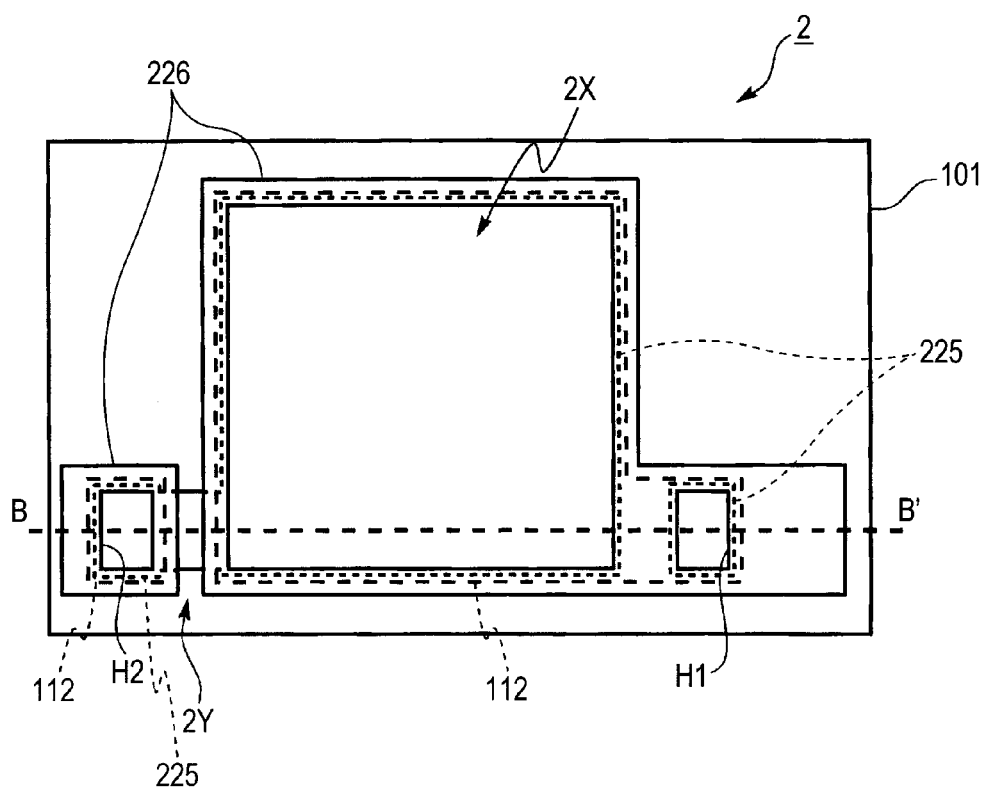
FIG. 5 is a plan view of a semiconductor device of a second embodiment according to the invention.
Figure 6:
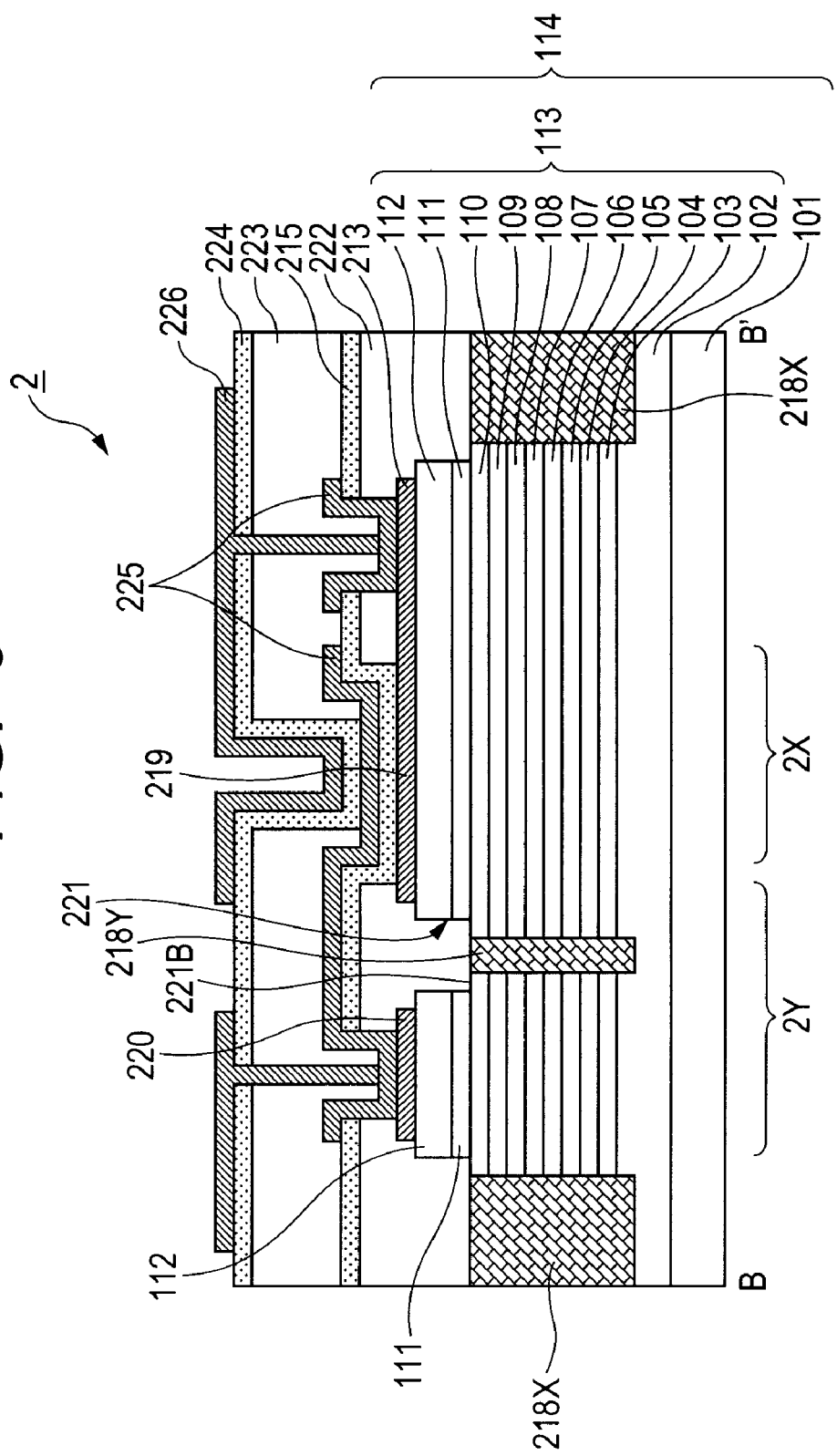
FIG. 6 is a cross sectional view along line B-B' in FIG. 5.

A configuration of a semiconductor device of a second embodiment according to the invention is to be described with reference to the drawings. FIG. 5 is a plan view and FIG. 6 is a cross sectional view along line B-B' of FIG. 5. Identical components with those in the first embodiment carry the same reference letters or numerals, for which description is to be omitted.

In the first embodiment, description has been made to a configuration of connecting the protective element in parallel with the MIM capacitor of the metal-insulator metal configuration in which a layer of nitride film is sandwiched between two metal layers. In this second embodiment, description is to be made with reference to a configuration of connecting the protective element in parallel with an MIMIM-2 layer capacitor of a metal-insulator-metal-insulator metal configuration.

As shown in FIG. 6, in a semiconductor device 2 of this embodiment, an MIMIM 2-layer capacitor (passive element, semiconductor element) 2X and a protective element 2Y for protecting the same are formed to an epitaxial wafer 114 in which a semiconductor stack 113 having stacked semiconductor layers 102 to 112 is formed over a semiconductor substrate 101.

The layer structure of the semiconductor stack 113 is identical with that of the first embodiment.

In this embodiment, a capacitor includes a lower capacitor electrode 213—a first nitride film 215—an upper electrode first layer interconnection 225—a second nitride film 224—upper electrode second layer interconnection 226. In the drawing, reference 222 denotes a first oxide film and reference 223 denotes a second oxide film.

In the same manner as in the first embodiment, a protective element 2Y is formed in adjacent with a capacitor 2X also in this embodiment. The protective element 2Y has the semiconductor stack 113 (semiconductor layers 102 to 112) in common with the capacitor 2X.

Also in the protective element 2Y, an n$^+$-GaAs cap layer 112 is formed in a predetermined pattern in the same manner as in the first embodiment. Also in the protective element 2Y, the n$^+$-GaAs cap layer 112 is removed partially to form a recessed portion 221 that penetrates the layer in the direction of the thickness. An insulation layer 218Y is formed in the semiconductor stack 113 from the surface at the bottom 221B of the recessed portion 221 in the direction of the thickness.

In the same manner as in the first embodiment, a pair of ohmic electrodes 219 and 220 are formed over the n$^+$-GaAs cap layer 112 formed on both sides of the recessed portion 221 in the protective element 2Y. The upper electrode first layer interconnection 225 and the upper electrode second layer interconnection 226 of the capacitor 1X are connected to the ohmic electrode 219.

As has been described above, the invention is applicable also to the semiconductor device 2 having an MIMIM 2-layered capacitor 2X and the same effect as that in the first embodiment can be obtained.

Also in this embodiment, a semiconductor device 2 suppressed from the electrostatic destruction and having a high reliability can be provided.

Also in this embodiment, the inventors could obtain a small-sized MIMIM capacitor having a electrostatic breakdown voltage of 350 V or higher by the MM method and 5 kV or higher by the HBM method.

Also in this embodiment, since the lower capacitor electrode 213 functions also as the electrode 219 an one side of the protective element 2Y and, further, the protective element 2Y is disposed in the forming region of the upper electrode interconnections 225 and 226 of the capacitor 2X, the element area for the total of the capacitor 2X and the protective element 2Y is small and the size of the semiconductor device 2 can be decreased.

Third Embodiment

Figure 7:
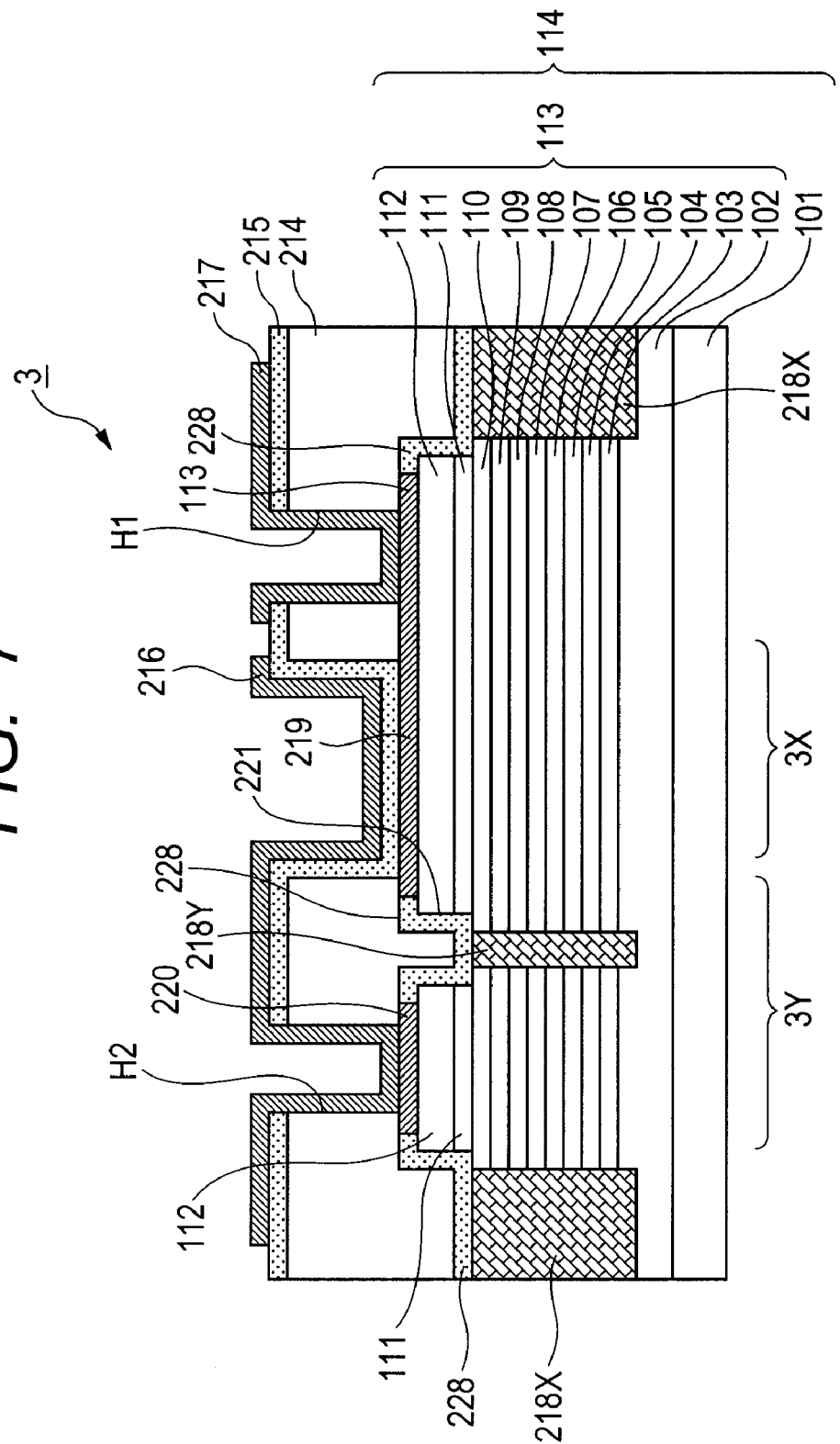
FIG. 7 is a cross sectional view of a semiconductor device of a third embodiment according to the invention.

A configuration of a semiconductor device of a third embodiment according to the invention is to be described with reference to the drawings. FIG. 7 is a cross sectional view. Identical components with those of the first embodiment carry the same references, for which description is to be omitted.

A semiconductor device 3 of this embodiment has a capacitor 3X and a protective element 3Y protecting the same. The semiconductor device 3 of this embodiment has the same basic configuration as the first embodiment. In the first embodiment, the oxide film 214 for insulating various kinds of electrodes or interconnections has been disposed over the insulation regions 218X and 218Y whereas, in this embodiment, a nitride film 228 for covering the insulation regions 218X and 218Y are disposed separately from the oxide films 214 for insulating various electrodes or interconnections.

Also in this embodiment, a semiconductor device 4 suppressed from electrostatic destruction and having a high reliability can be provided. The present inventors could obtain a small-sized MIM capacitor having a high electrostatic breakdown voltage of 350 V or higher by the MM method and 5 kV or higher by the HBM method also in the configuration of this embodiment.

Fourth Embodiment

While the channel layer has been formed of the non-doped InGaAs layer in the first embodiment, the channel layer may be of any composition/conduction type so long as the n type carriers can be accumulated. The channel layer may be formed, for example, of an n$^+$-GaAs layer. The layer structure of the semiconductor stack can also be changed properly in the design conforming to the composition of the channel layer.

Figure 8:
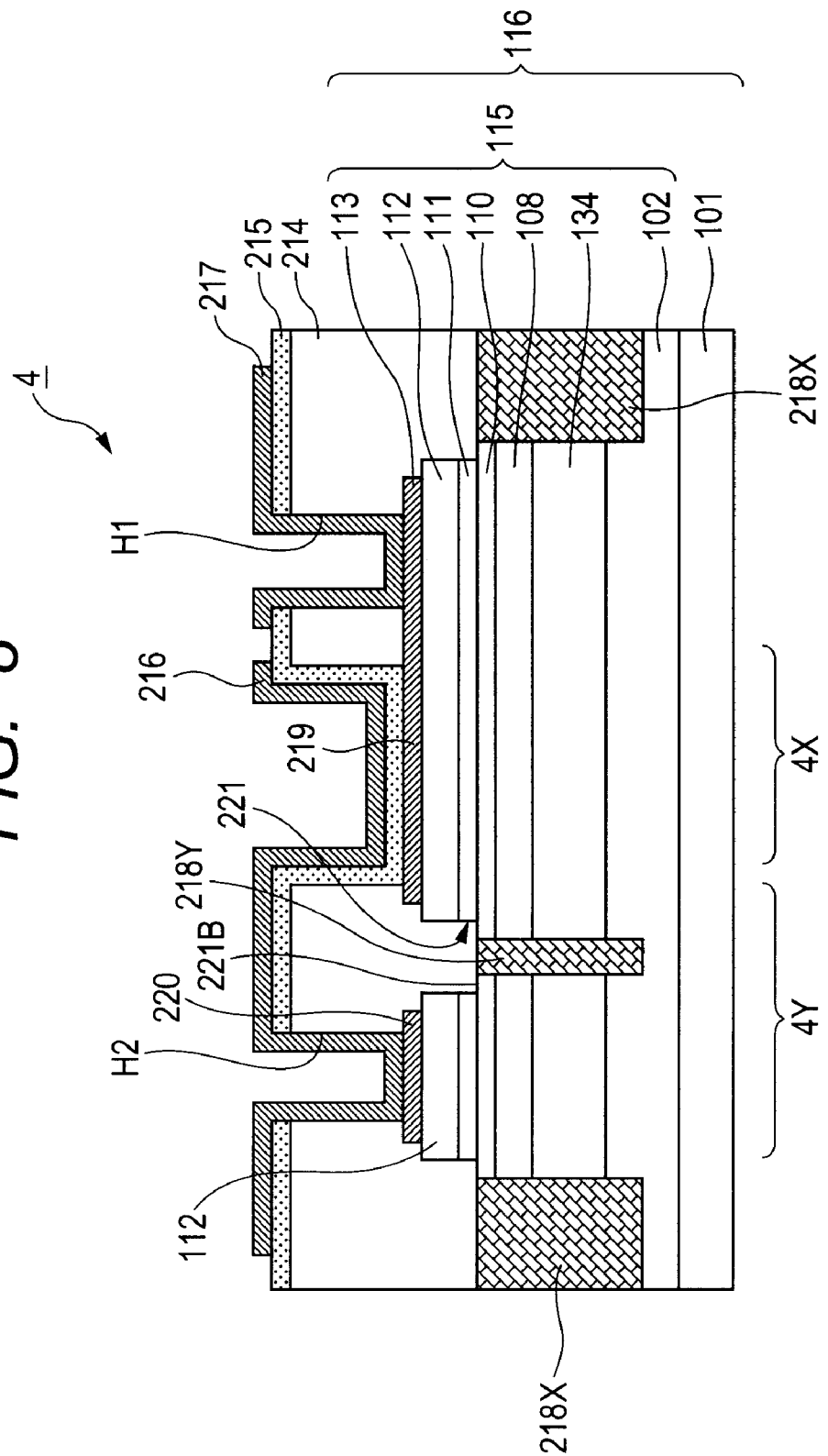
FIG. 8 is across sectional view of a semiconductor device of a fourth embodiment according to the invention.

A configuration of a semiconductor device of a fourth embodiment according to the invention is to be described with reference to the drawings. FIG. 8 is a cross sectional view. Identical components with those in the first embodiment carry the same references, for which description is to be omitted.

A semiconductor device 4 of this embodiment has a capacitor 4X and a protective element 4Y for protecting the same. The semiconductor device 4 of this embodiment has the same basic configuration as in the first embodiment and is different from the first embodiment in view of the layer structure of a semiconductor stack 115 (epitaxial wafer 116).

In this embodiment, the layer structure of the epitaxial wafer 116 on the side of the semiconductor substrate 101 is as described below.

Semiconductor GaAs substrate 101,
non-doped stacked buffer layer 102 of 500 nm thickness,
n$^+$-GaAs channel layer 134,
non-doped AlGaAs layer 108 of 20 nm thickness,
non-doped GaAs layer 110 of 15 nm thickness,
n$^+$-AlGaAs stopper layer 111 of 5 nm thickness with addition of an Si impurity at $4.0 \times 10^{18}$ cm$^{-3}$, and
n$^+$-GaAs cap layer 112 of 100 nm thickness with addition of an Si impurity at $4.0 \times 10^{18}$ cm$^{-3}$.

Also in this embodiment, a semiconductor device 4 suppressed from electrostatic destruction and having a high reliability can be provided. The present inventors could obtain a small-sized MIM capacitor having a high electrostatic breakdown voltage of 350 V or higher by the MM method and 5 kV or higher by the HBM method also in the configuration of this embodiment.

Fifth Embodiment

Figure 9:
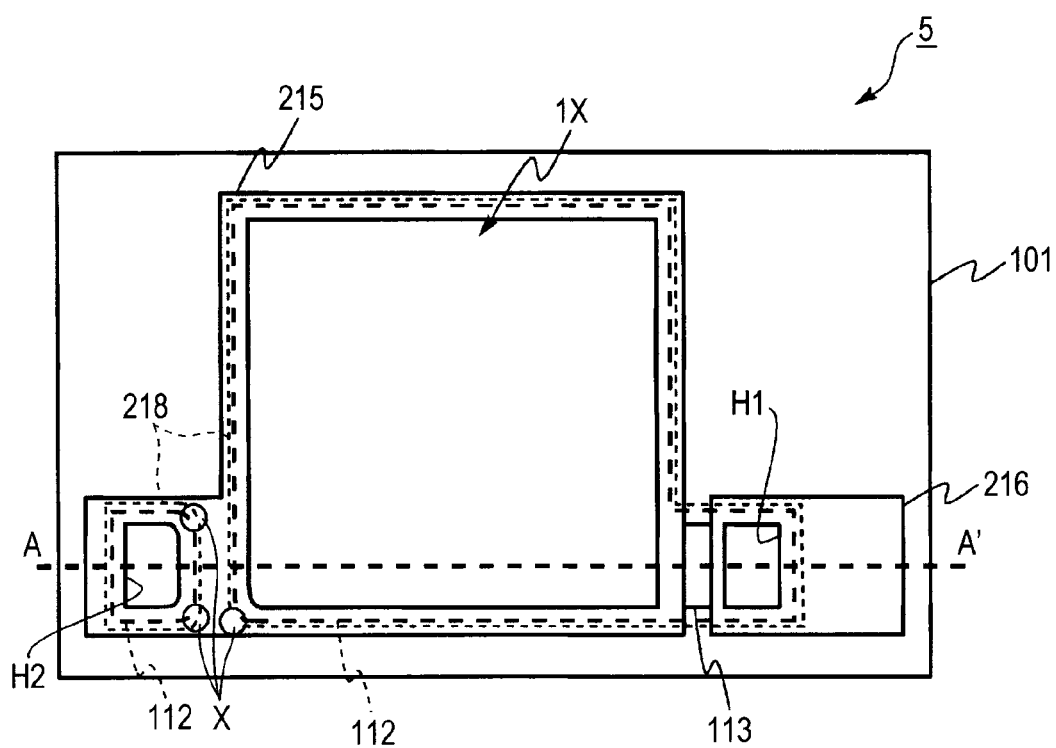
FIG. 9 is a plan view of a semiconductor device of a fifth embodiment according to the invention.

A configuration of a semiconductor device of a fifth embodiment according to the invention is to be described with reference to the drawings. FIG. 9 is a plan view. Since the cross sectional structure is identical with that in FIG. 2, it is not illustrated. In FIG. 9, contours for an insulation region 218X and an insulation region 218Y are denoted by a reference 218. Identical components with those in the first embodiment carry the same references for which descriptions is to be omitted.

A semiconductor device 5 of this embodiment has the same basic configuration as in the first embodiment and is different from the first embodiment in view of the planar pattern of the components for the passive element.

As shown in FIG. 9, in the semiconductor device 5 of this embodiment, corner portions X for the semiconductor stacks 113 and the ohmic electrodes 219 and 220 which are formed sandwiching the insulation region 218Y of the protective element 1Y are rounded by chamfering.

Also in this embodiment, a semiconductor device 5 suppressed from the electrostatic destruction and having a high reliability can be provided. In this embodiment, concentration of electric fields to the corner portions X is moderated to obtain a higher electrostatic breakdown voltage. The present inventors could obtain a small-sized MIM capacitor having a high static breakdown voltage of 400 V or higher by the MM method and 6 kV or higher by the HBM method.

The effect of moderating the concentration of the electric fields at the corner portions X can be obtained by chamfering at least one of the corner portions X of the semiconductor stacks 113 which are formed sandwiching the insulation region 218Y of the protective element 1Y.

Sixth Embodiment

Figure 10:
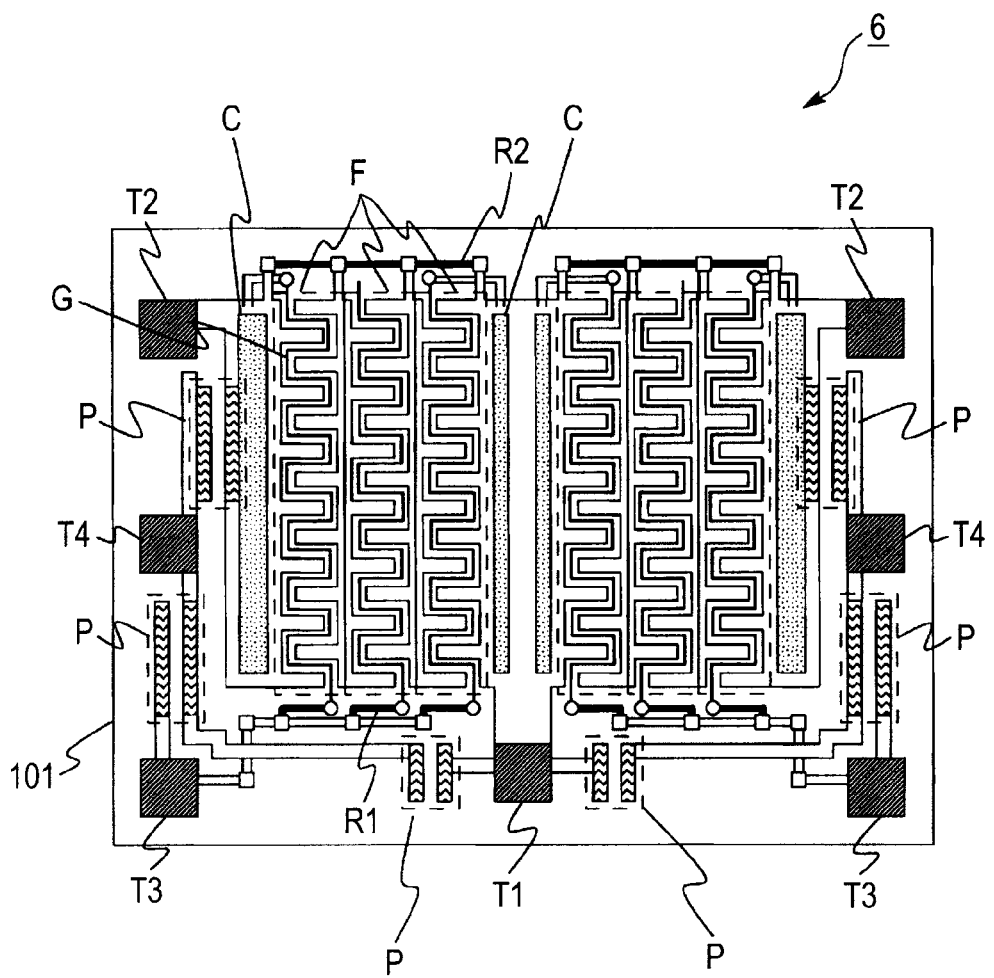
FIG. 10 is a plan view of a semiconductor device of a sixth embodiment according to the invention.
Figure 11:
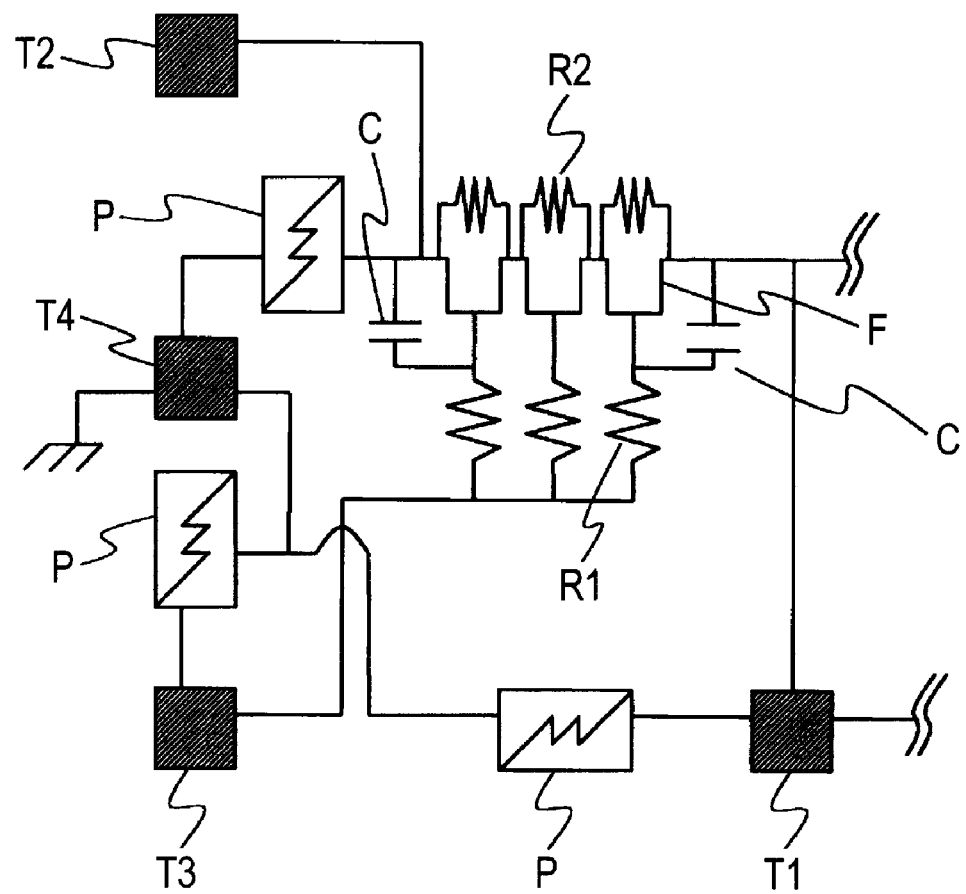
FIG. 11 is an equivalent circuit diagram of a semiconductor device of a sixth embodiment according to the invention.

A configuration of a semiconductor device of a sixth embodiment according to the invention is to be described with reference to the drawings. FIG. 10 is a plan view and FIG. 11 is an equivalent circuit diagram.

While the first to fifth embodiments are those for a semiconductor device comprising a combination of the capacitor and the protective element, this sixth embodiment is a semiconductor device having a combination of a field effect transistor (FET), a capacitor, and a protective element as semiconductor elements. In this embodiment, description is to be made to an example of a GaAs switch IC chip. Since the switch IC shown in FIG. 10 has a circuit configuration in right to left symmetry, an equivalent circuit diagram is shown for the left-half thereof in FIG. 11.

A semiconductor device 6 of this embodiment includes a plurality of capacitors C, a plurality of field effect transistors F, and a plurality of protective elements P for protecting the capacitors C and the field effect transistors F. In the field effect transistor F, reference R1 denotes a gate resistance and reference R2 denotes a jump resistor, respectively.

The semiconductor device 6 includes an antenna terminal portion T1, a plurality of output terminal portions T2, and a plurality of control terminal portions T3 as external connecting terminal portions for connecting the semiconductor device 6 and external terminals of an IC package, etc. The semiconductor device 6 also includes a plurality of ground terminal portions T4 for ground connecting of interconnections.

The capacitive element P has the same element configuration as the protective elements 1X to 4X of the first to fourth embodiments and includes a recessed portion that penetrates the cap layer in the direction of the thickness, an insulation region formed in the semiconductor stack from the bottom of the recessed portion in the direction of the thickness, and a pair of ohmic electrodes formed on both sides of the recessed portion and connected to the cap layer.

In this embodiment, the protective element P is disposed corresponding to each of the terminal portions T1 to T3 and each of the external connecting terminal portions T1 to T3 is electrically connected with the ground terminal portion T4 by way of the protective element P.

In the semiconductor device 6 of this embodiment, in a case where static electricity is applied from the external terminal to any of the external connecting terminal portions T1 to T3, since the static electricity is discharged to the ground through the protective element P, a high electrostatic breakdown voltage can be obtained.

According to this embodiment, a semiconductor device 6 (switch IC) suppressed for electrostatic destruction and having a high reliability can be provided. When the present inventors evaluated the electrostatic breakdown voltage by the MM method for the switch IC having the configuration of this embodiment and for the existent switch IC of the same configuration as in this embodiment except for not providing the protective element P. The former had a higher voltage value than the latter by 90 V.

Seventh Embodiment

Figure 12:
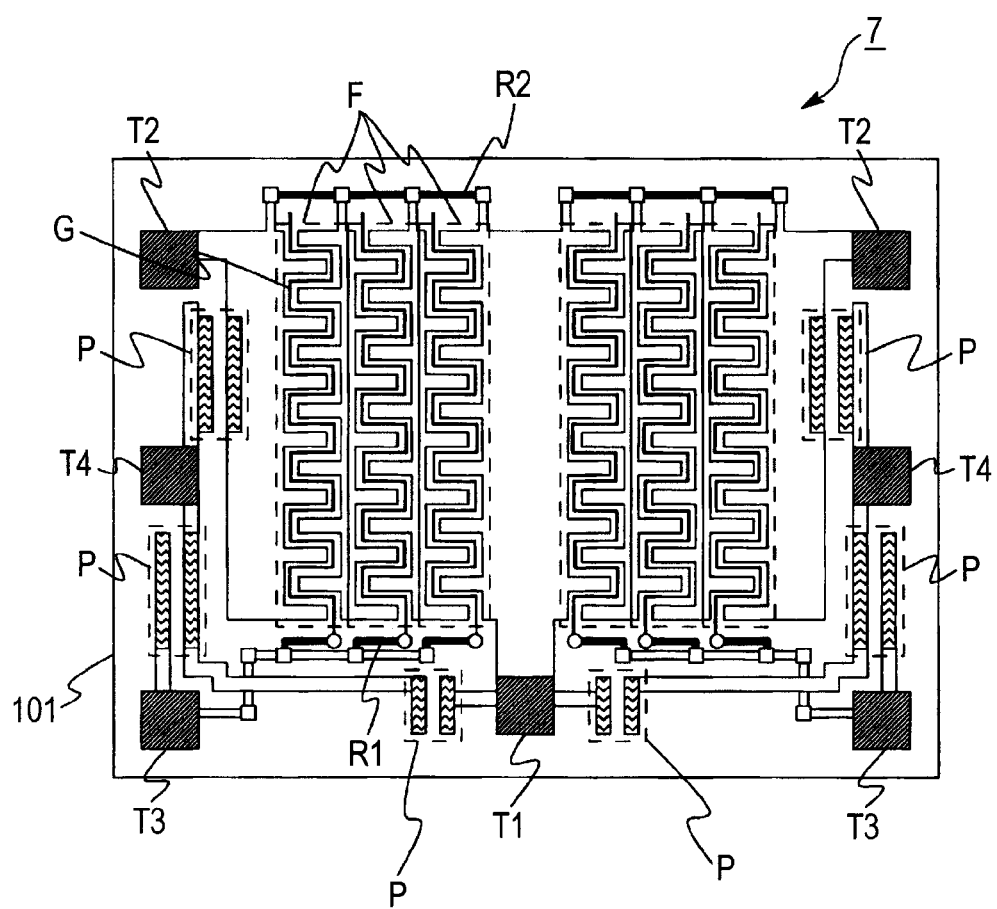
FIG. 12 is a plan view of a semiconductor device of a seventh embodiment according to the invention.
Figure 13:
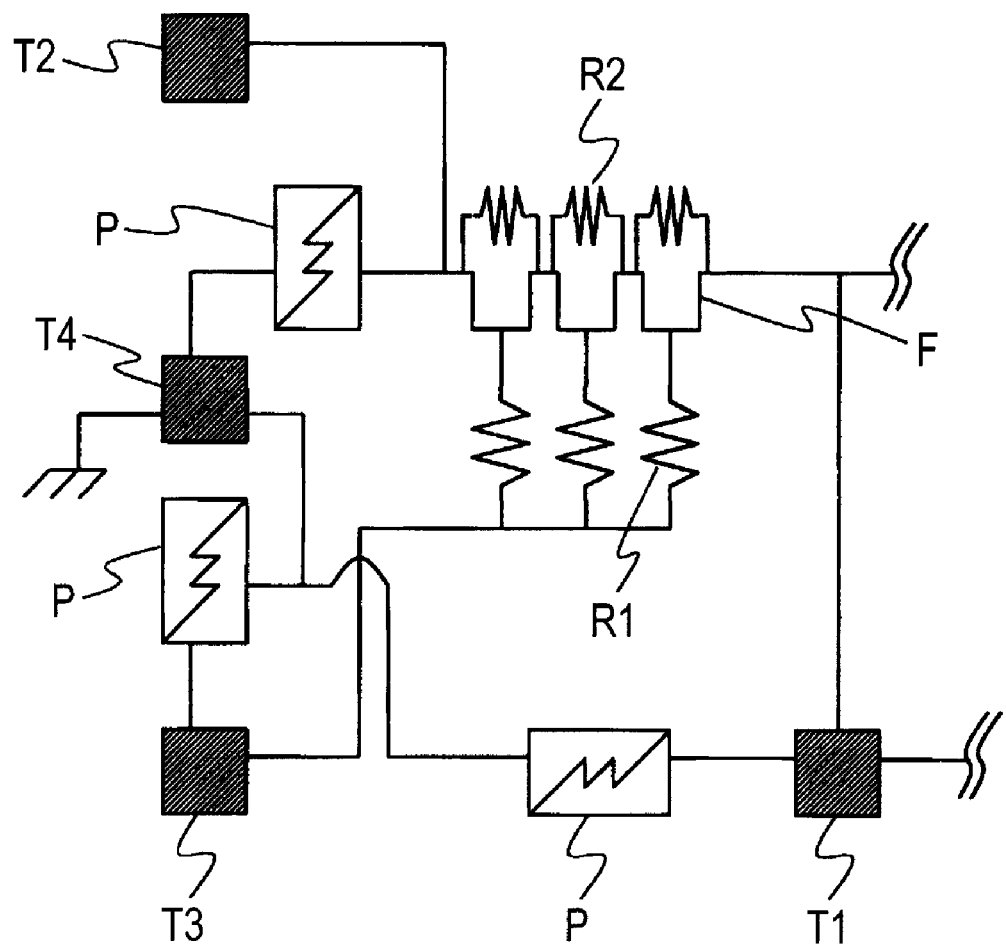
FIG. 13 is an equivalent circuit diagram of a semiconductor device of a seventh embodiment according to the invention.

A configuration of a semiconductor device of a seventh embodiment according to the invention is to be described with reference to the drawings. FIG. 12 is a plan view and FIG. 13 is an equivalent circuit diagram. Components identical with those of the sixth embodiment carry the same reference numerals for which description is to be omitted. This seventh embodiment is also an example of a GaAs switch IC chip and, since the switch shown in FIG. 12 has a circuit configuration right to left symmetry, an equivalent circuit diagram is shown for the left-half thereof in FIG. 13.

A semiconductor device 7 of this embodiment includes a plurality of field effect transistors F and a plurality of protective elements P for protecting the field effect transistors F.

The semiconductor device 7 includes antenna terminal portion T1/output terminal portion T2/control terminal portion T3, and ground terminal portion T4 as external connecting terminal portions in the same manner as the sixth embodiment.

Also in this embodiment, the protective element P has a configuration substantially identical with that of the protective elements 1X to 4X of the first to fourth embodiments and includes a recessed portion that penetrates the cap layer in the direction of the thickness, an insulation region formed in the semiconductor stack from the bottom of the recessed portion in the direction of the thickness, and a pair of ohmic electrodes formed on both sides of the recessed portion and connected to the cap layers.

Also in this embodiment, one protective element P is disposed corresponding to each of the terminal portions T1 to T3 and each of the external connecting terminal portions T1 to T3 is electrically connected by way of the protective element P with the ground terminal portion T4.

Also in the semiconductor device 7 of this embodiment, even when static electricity is applied to any of the external connecting terminal portions T1 to T3 from the external terminal, since the static electricity is discharged to the ground through the protective element P, a high electrostatic breakdown voltage can be obtained.

According to this embodiment, a semiconductor device 7 (switch IC) suppressed from electrostatic destruction and having a high reliability can be provided. When the present inventors evaluated the electrostatic breakdown voltage for the switch IC having the configuration of this embodiment and an existent switch IC of the same configuration as this embodiment except for not providing the protective element P by the MM method, the former had a higher electrostatic breakdown voltage value from the latter by 90 V.

What is claimed is:

1. A semiconductor device comprising:
   at least one semiconductor element having a semiconductor stack containing a channel layer and a cap layer and a lower electrode and an upper electrode formed over the semiconductor stack, and
   at least one protective element having a semiconductor stack in common with the semiconductor element for protecting the semiconductor element,
   wherein the protective element has a recessed portion that penetrates the cap layer in the direction of the thickness, an insulation region formed in the semiconductor stack from the bottom of the recessed portion in the direction of the thickness and a pair of ohmic electrodes formed on both sides of the recessed portion and connected to the cap layer, and
   wherein one of the pair of ohmic electrodes of at least one protective element is in common with the lower electrode of the semiconductor element and the other of them is connected electrically with the upper electrode of the semiconductor element and electrically connected in parallel with the semiconductor element.

2. The semiconductor device according to claim 1, wherein at least one protective element is formed in the forming region of the upper electrode and the upper electrode interconnection of the semiconductor device.

3. The semiconductor device according to claim 1, wherein at least one of corner portions of the semiconductor stack formed on both sides of the insulation region of the protective element electrically connected in parallel with the semiconductor element, and the pair of ohmic electrodes is chamfered.

4. The semiconductor device according to claim 1, wherein at least one external connection terminal portion is provided and, at least one protective element is connected with the external connection terminal portion.

5. The semiconductor device according to claim 1, wherein at least one of the pair of ohmic electrodes of at least one protective element is connected to the ground.

6. The semiconductor device according to claim 1, wherein capacitor and/or transistor is provided as a semiconductor element.

7. A protective element for protecting a semiconductor element having a semiconductor stack containing a channel layer and a cap layer and a pair of electrodes, comprising:
   a semiconductor stack in common with the semiconductor element; and
   a recessed portion that penetrates the cap layer in the direction of the thickness, an insulation region formed in the semiconductor stack from the bottom of the recessed portion in the direction of the thickness, and a pair of ohmic electrodes formed on both sides of the recessed portion and connected to the cap layer,
   wherein at least one of the corner portions of the semiconductor stack formed on both sides of the insulation region and the pair of ohmic electrodes are chamfered.

8. The protective element according to claim 7, wherein one of the pair of ohmic electrodes is connected to the ground.

* * * * *